United States Patent [19]

Leung

[11] Patent Number: 5,432,707
[45] Date of Patent: Jul. 11, 1995

[54] AUTOMATED CIRCUIT DESIGN

[75] Inventor: Yiu M. Leung, Endicott, N.Y.

[73] Assignee: International Business Machines Corporation, Armonk, N.Y.

[21] Appl. No.: 16,619

[22] Filed: Feb. 12, 1993

[51] Int. Cl.$^6$ .............................................. G06F 17/50
[52] U.S. Cl. .................................... 364/489; 364/488
[58] Field of Search ....................... 364/488, 489, 490

[56] References Cited

U.S. PATENT DOCUMENTS

| | | | |
|---|---|---|---|
| 4,815,003 | 3/1989 | Putatunda et al. | 364/491 |
| 5,282,148 | 1/1994 | Poirot et al. | 364/491 |
| 5,287,289 | 2/1994 | Kageyama et al. | 364/489 |

OTHER PUBLICATIONS

"Bold: The Boulder Optimal Logic Design System", pp. 59–73, IEEE Transactions, 1989, by G. Hachtel et al.

"Technology Mapping of Digital Circuits", pp. 580–586, Advanced Computer Technology, Reliable Systems and Applications 5th Annual European Computer Conference, May, 1991, by G. De Micheli.

"Automatic Synthesis and Technology Mapping of Combinational Logic", pp. 466–469, IEEE Transactions, 1988, by R. Bergamaschi.

"Impact of Library Size on the Quality of Automated Synthesis", pp. 120–123, IEEE Transactions, 1987, by K. Keutzer et al.

"Technology Mapping in MIS", pp. 116–119, IEEE Transactions, 1987, by E. Detjens et al.

"Designing A CMOS Standard Cell Library", pp. 237–240, IEEE Custom Integrated Circuits Conference, 1987, by S. Sunter.

"Library Specific Optimization of Multilevel Combinational Logic", pp. 411–415, IEEE Transactions, 1985, by K. Bartlett et al.

"Matching a parts library in a silicon compiler", pp. 169–172, IEEE Transactions, 1986, by M. Kahrs.

"Depth-First Search and Dynamic Programming Algorithms for Efficient CMOS Cell Generation", IEEE Transactions on Computer Aided Design, vol. 8, No. 7, Jul., 1989, pp. 737–743, by R. Bar-Yehuda et al.

"Optimal Cell Generation for Dual Independent Layout Styles", IEEE Transactions on Computer Aided Design, vol. 10, No. 6, Jun., 1991, pp. 770–782, by B. Carlson et al.

"MIS: A Multiple-Level Logic Optimization System", IEEE Transactions on Computer Aided Design, vol. CAD-6, No. 6, Nov., 1987, pp. 1062–1081, by R. Brayton.

"DAGON: Technology Binding and Local Optimization by DAG Matching", ACM/IEEE Design Automation Conference, 1987, pp. 341–347, by K. Keutzer.

*Primary Examiner*—Vincent N. Trans
*Attorney, Agent, or Firm*—Arthur J. Samodovitz

[57] ABSTRACT

A method for designing a digital circuit using a multiplicity of cells is disclosed. Each of the cells comprises a plurality of digital components. The goal of the method is to identify and use cells having a limited number of series transistors because the delay through the cell is related to the number of series transistors. The method comprises the step of selecting a maximum number of series transistors to be permitted in any one cell. Then a tree graph representing the digital circuit is generated. The tree graph comprises a multiplicity of nodes and respective children. Each of the nodes corresponds to a digital function within the digital circuit and each of the children represents an input for one of the digital functions. Next, an algorithm is executed at a multiplicity of the nodes to determine at each of the nodes a number of series transistors required by a cell rooted at the node. Then, a partial subgraph rooted at each of the nodes which has a number of series transistos less than or equal to the maximum number is selected. Each of the partial subgraphs comprises the respective root node and one or more descendents of the root node. Next, data describing a physical representation of one or more of the selected partial subgraphs is fetched or generated. Finally, the circuit is fabricated using the data for the fetched or generated cells.

9 Claims, 2 Drawing Sheets

AUTOMATED CIRCUIT DESIGN

BACKGROUND OF THE INVENTION

The invention relates generally to automated circuit design, and deals more particularly with a process for designing a circuit using cells each comprised of plural components.

A digital circuit comprises a large number of digital components such as AND gates, OR gates, and Inverters. To fabricate the circuit as an integrated circuit, it is helpful to provide a library of cells that each represent a plurality of the digital components. With such a library, the circuit designer need only select which cells are required to implement the circuit and interconnect the cells, and need not lay-out and interconnect each digital component. Because there are many more individual components than cells, the use of the cells, once designed, substantially reduces the work required to fabricate the integrated circuit.

The larger the cells, the less the work required to lay out and interconnect the entire circuit and the less real estate area required for the entire circuit. However, the larger the cells the greater the tendency for excessive "fan-in" and excessive number of transistors to be in series, and both reduce switching speed.

The design of each cell is a two step process. First, components which make-up each cell are defined, and then the defined components of the cell are layed-out within the cell. For example, the cell may be defined to implement the boolean function (A+B)C+(DE), and then layed-out for the library based on a representation of each OR (+) function by two (or more) FETs in parallel and each AND (no separator) function by two (or more) FETs in series. The boolean inputs are applied to the gates of the respective FETs. There are many known techniques to define and lay-out the cells for the library. For example, "Depth-First Search and Dynamic Programming Algorithm for Efficient CMOSS Cell Generation" by Reuven Bar-Yehuda et al, IEE Transactions on Computer Aided Design, vol. 8. no.7 July 1989 pages 737–743 and "Optimal Cell Generation for Dual Independent Layout Style" by Bradley S. Carlson et al, IEE Transactions on Computer Aided Design, vol. 10, no. 6, June 1991 pages 770–782 describe techniques to define and lay-out the cells. A prior art Yorktown Silicon Compiler also determines and limits the number of series transistors in each component. Nevertheless, these techniques do not adequately consider fan-in and the number of series transistors within each cell.

Accordingly, an object of the present invention is to provide a method and apparatus for automatically designing circuits using cells having limited fan-in and number of transistors in series yet being large enough to be helpful in the fabrication.

SUMMARY OF THE INVENTION

The invention resides in a method for designing a digital circuit using a multiplicity of cells, each of the cells comprising a plurality of digital components. The goal of the method is to identify and use cells having a limited number of series transistors because the delay through the cell is related to the number of series transistors. The method comprises the step of selecting a maximum number of series transistors to be permitted in any one cell. Then a tree graph representing the digital circuit is generated. The tree graph comprises a multiplicity of nodes and respective children. Each of the nodes corresponds to a digital function within the digital circuit and each of the children represents an input for one of the digital functions. Next, the following algorithm is executed at a multiplicity of the nodes to determine at each of the nodes a number of series transistors "s" required by a cell rooted at the node:

if the node is an AND gate, s=s of node itself plus summation [s of each child −1]
if the node is an OR gate, s=max [s of each child]
if the node is an Inverter, s=s of child plus 1
wherein s=1 for an Inverter;
s=n for an n input AND gate; and
s=1 for an n input OR gate.

Then, a partial subgraph rooted at each of the nodes which has an "s" value less than or equal to the maximum number is selected. Each of the partial subgraphs comprises the respective root node and one or more descendents of the root node. Next, data describing a physical representation of one or more of the selected partial subgraphs is fetched or generated. Finally, the circuit is fabricated using the data for the fetched or generated cells.

According to one feature of the present invention, cells limited to nodes in a critical path are identified.

According to another feature of the present invention, the delay through a cell is estimated based on the number of series transistors in a pull-down portion of the cell and a number of parallel transistors in a pull-up portion of the cell.

DETAILED DESCRIPTION OF THE PREFERRED EMBODIMENTS

Figure 1:
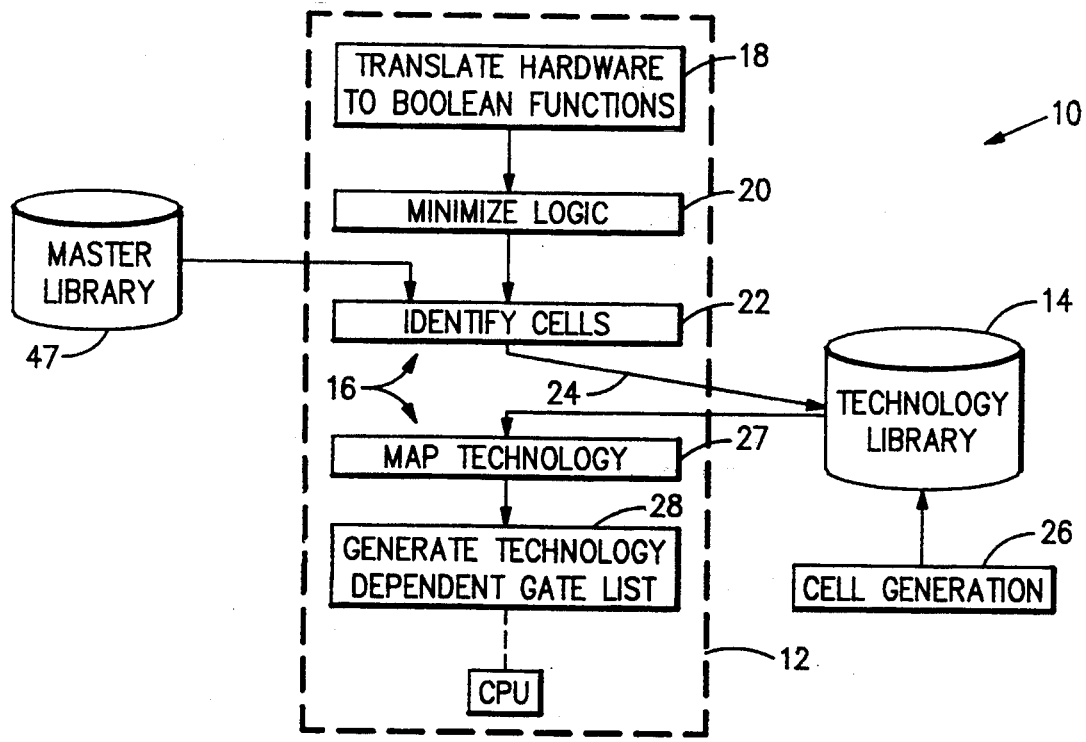
FIG. 1 is a block diagram of a computer system that implements the present invention.

Referring now to the drawings in detail wherein like reference numerals indicate like elements throughout the several views, FIG. 1 illustrates a computer system generally designated 10 for designing cells of components according to the present invention. System 10 comprises a workstation or personal computer 12, a storage device 13 such as a disk to store a library 14 of cells to fabricate a circuit, a master library 47 of standard cells and a program 16 to instruct computer 12 in the design of the cells according to the present invention.

At a high level, the program instructs the workstation to translate a hardware description of the circuit into equivalent boolean equations using well known techniques (step 18). Next, the program instructs the workstation to perform logic minimization on the boolean equations using well known techniques such as that described in "MIS: A Multiple-Level Optimization System" by Robert K. Brayton, IEEE Transactions on Computer Aided Design, vol. CAD-6 no. 6, November, 1987 pages 1062–1081, to avoid redundant gates (step 20). Next, according to the present invention, the program instructs the workstation to identify components within the circuit that can be formed into a cell as described in more detail below (step 22). Next, the program instructs the workstation to search the library 14 of cells on disk 13 for the identified cells (step 24). Each of the cells stored in the library corresponds to a specific arrangement of digital components, and includes for that arrangement a well known translation from the logical representation of nodes and descendants to a physical representation of macros. If the cell is not stored in the library, then another system generates the cell using well known techniques such as that described by Reuven Bar-Yehuda et al. and Bradley S. Carlson et al. above (step 26). After obtaining the cell, either from the library or the generating system, the program 16 instructs the workstation to translate the physical representations to the specific transistor technology desired in a well known manner such as that described in "Technology Mapping in MIS" by Ewald Detjes et al., Proceedings of the International Workshop on Logic Synthesis, May 1987, pages 116–119 and "DAGON: Technology Binding and Local Optimization by DAG Matching" by Kurt Keutzer, proceedings of the 24th ACM/IEEE Design Automation Conference, 1987, pages 341–347 (step 27). Finally, the program 16 instructs the workstation to generate a list of interconnections between the many cells to form the circuit in a well known manner (step 28).

Figure 2:
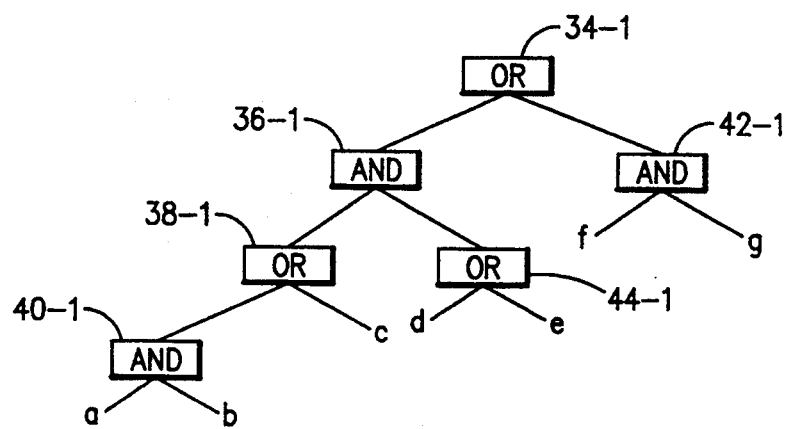
FIG. 2 illustrates a Directed Acylic Graph which is generated as one step of the present invention.

The following is a more detailed explanation of the cell identification step 22 according to the present invention. The program represents the boolean equations of the complex circuit by a tree graph called a Directed Acylic Graph (DAG) 30 illustrated in FIG. 2. Each node in the graph represents a digital component which performs a logical AND, OR or Inverter function of a circuit 32 illustrated in FIG. 3, and each child of the node represents an input to the component. The nodes and children of the tree graph are in direct one-to-one correspondence with functions of the circuit as indicated by the reference numbers. Such a representation of a digital circuit into a DAG tree graph is well known in the prior art. See the publication by Kurt Keutzer above. It should be noted that for purposes of illustration, circuit 32 is highly simplified and often there are hundreds of thousands of digital components within the circuit. Also, many portions of a typical circuit are repeated many times. For example, in massively parallel processor systems, the components of each processor are repeated many times. Therefore, according to the present invention, some of the cells are designed dynamically and used for many other identical (or functionally identical) parts of the same circuit.

The next step according to the present invention is to determine which groups of components within the tree graph should be provided by a cell. The prevailing restriction is to limit the fan-in and number of transistors in series within the entire cell to a predetermined number. Both of these factors are considered by determining the result of the following recursive algorithm:

if the node is an AND gate, $s = s$ of node itself plus summation [$s$ of each child $-1$]
if the node is an OR gate, $s = \max$ [$s$ of each child]
if the node is an Inverter, $s = s$ of child plus 1
wherein $s = 1$ for an Inverter;
$s = n$ for an n input AND gate; and
$s = 1$ for an n input OR gate.

The resultant "s" calculated at each node equals the number of series transistors (in a pull-down portion 50b of the cell) that would exist if a cell rooted at this node and including all the descendent nodes and inputs included in the calculation were fabricated. It should be noted that if the s value calculated at a node for all descendent nodes and inputs exceeds the predetermined limit, then one or more of the lower level descendent nodes can be discarded to bring the s value to within the predetermined limit. In the circuit 30, the s value for each of the specified nodes and all respective descendent inputs and nodes are as follows:

node 34=3
node 36=3
node 38=2
node 40=2
node 42=2
node 44=1

Then, a partial subgraph, rooted at each node, with the largest s value less than or equal to the predetermined level is identified. Thus, one such partial subgraph is identified for each node. For example, if the predetermined limit for s=2, then one of the subgraphs for root node 36 with the largest s less than or equal to 2 comprises nodes 36, 44 and 38. The partial subgraphs for the nodes may overlap each other or be distinct. These partial subgraphs will ultimately form a collection of cell candidates from which to identify the cells to be added to the technology library 14.

Next, a partial subgraph from the collection is selected (randomly) and added to the library 14 if two conditions are met. First, the partial subgraph is not functionally identical to another cell already in the library 14 and second, there must be at least a predetermined number of other functionally equivalent cells in the collection. The second condition strives to identify those cells for which dynamic cell design will be useful for many other parts of the entire circuit. Then, the partial subgraphs and all other functionally equivalent subgraphs in the collection are removed from the collection. This step of selecting the partial subgraphs is repeated until the collection is empty.

Next, the partial subgraphs in the critical path are identified and the s values for these partial subgraphs are calculated. The critical paths are identified by flagging all primary output nodes in the overall circuit, i.e. those nodes which provide an output signal from the circuit. Then, the input to each of these nodes that arrives latest of all the inputs to the same node is flagged. Such inputs also indicate the critical path. Then, each node which is not flagged is removed, and the remainder are the one or more critical paths from the circuit inputs to the output nodes.

Next, the foregoing steps of determining the s value and selecting the cells is repeated for each remaining node, i.e. the ones in the critical path. However, the s values are determined only for the nodes in the critical path; the nodes that are not in the critical path, even if a child of a node in the critical path, are not considered in the determination of the s values. The corresponding cell comprises the identified node and all other nodes and children in the critical path but not other nodes or children outside the critical path even if descendent from the identified node or the other nodes and children in the critical path. The purpose of restricting the cells to the nodes in the critical path is to avoid delays (caused by additional series transistors) introduced by other nodes outside the critical path. Nevertheless, the search for the cells containing the maximum number of series transistors permitted by the predetermined limit is important because such cells provide the greatest savings in real estate and lay-out and interconnection time between cells. The reason to limit the second search to cells in the critical path is the fact that the critical path, by definition, includes the most series transistors and therefore the most delay. Therefore, it is vital to limit the number of series transistors in the cells that form the critical path.

Then, a master library 47 is searched to attempt to locate all of the cells identified in all iterations, those anywhere in the circuit and those restricted to the critical path. The master library will not likely store all the cells identified in both analysis. The remainder can be generated using a previously known cell generation technique as cited above. The inclusion of both sets of cells in the library 14 increases the chances that the technology library 14 will store all the cells needed to fabricate the entire circuit.

Figure 3:
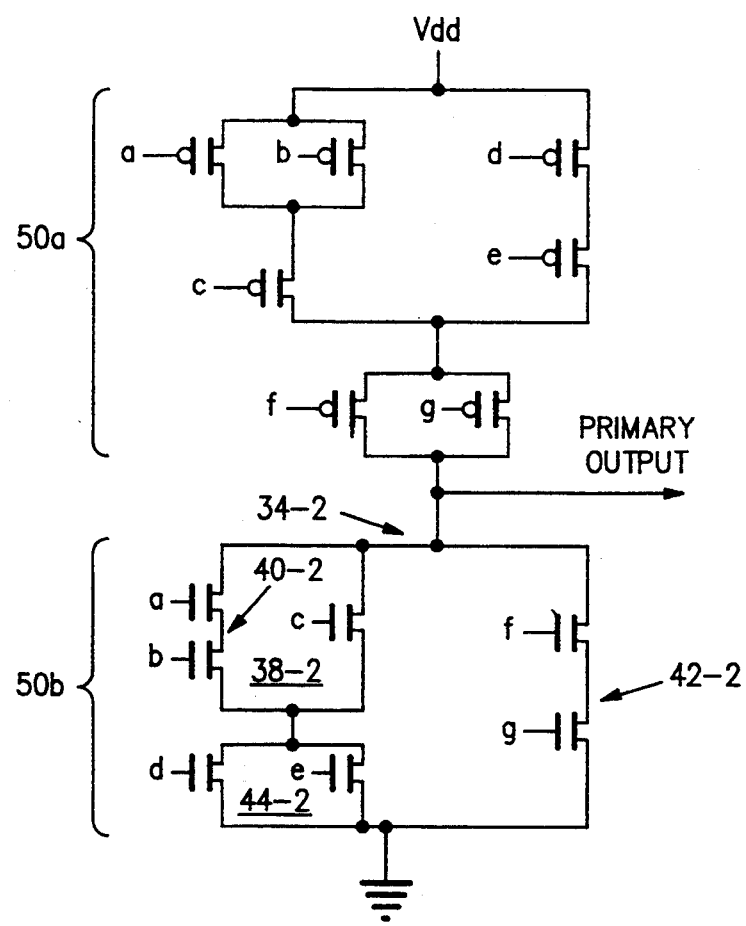
FIG. 3 is a detailed diagram at the transistor level of a circuit to be fabricated from cells designed according to the present invention. This circuit corresponds to the Directed Acylic Graph of FIG. 2.

According to another embodiment of the present invention, program 16 estimates a delay through each cell. As illustrated in FIG. 3, if all the illustrated circuitry is provided by one cell, the actual circuitry of the cell comprises complementary pull-up section 50a and pull-down section 50b which cooperate to implement the respective function illustrated in FIG. 2. The pull-up section 50a expedites the generation of the high outputs and the pull-down section 50b expedites the generation of the low outputs.

The delay is based on the s value for the root node and a "p" (parallel) value for the root node. The p value is calculated according to the following algorithm.

if the root is an AND gate, p=max[p of each child]
if the root is an OR gate, p=p of root plus sum[p of each child−1]
if the root is an Inverter, p=p of child plus 1 where
  p=1 for an inverter,
  p=1 for an n input AND gate, and
  p=n for an n input OR gate.

The delay through the cell is estimated based on the following equation: Delay=K×(2×p+s) where K is a technology dependent parameter proportional to the fall time of a unit size N channel transistor. If the delay through any cell is greater than a predetermined limit, then the cell is not used in the circuit fabrication.

Based on the foregoing, processes for designing cells for digital circuit design have been disclosed according to the present invention. However, numerous modifications and substitutions can be made without deviating from the scope of the present invention. For example, the foregoing algorithm can be used to determine the s values of cells existing in a library to exclude those cells which have an excessive fan-in or number of transistors in series. Also, the foregoing algorithm can be used to limit the s values of the cells in the critical path to a lower value than the cells outside of the critical path. Therefore, the invention has been disclosed by way of illustration and not limitation, and reference should be made to the following claims to determine the scope of the present invention.

I claim:

1. A method for fabricating a digital circuit, said method comprising the steps of:
   generating a tree graph comprising a multiplicity of nodes and respective children, each of said nodes corresponding to a digital function within said digital circuit and each of said children representing an input for one of the digital functions;
   for each of a multiplicity of said nodes,
     if the node is an AND gate, determining $s_{cell}$=s of node itself plus summation (s of each child−1),
     if the node is an OR gate, determining $s_{cell}$=max (s of each child), and
     if the node is an Inverter, determining $s_{cell}$=s of child plus 1,
     wherein s=1 for an Inverter, s=n for an n input AND gate, and s=1 for an n input OR gate; and
   fabricating the circuit based on a physical representation of a plurality of partial subgraphs rooted at respective nodes which have "$s_{cell}$" values less than or equal to a specified number, each of said partial subgraphs comprising the respective root node and one or more descendants of said root node.

2. A method as set forth in claim 1 further comprising the step of identifying partial subgraphs comprising nodes on a critical path through said circuit; and wherein the $s_{cell}$ determinations are performed using nodes in the critical path and excluding nodes outside of the critical path.

3. A method as set forth in claim 1 wherein data describing physical representations of some of said plurality of subgraphs are fetched from a library and data describing physical representations of other of said plurality of subgraphs which occur identically or functionally identically a multiplicity of times in said circuit are generated.

4. A method as set forth in claim 1 further comprising the step of storing data describing said physical representation of one or more of said plurality of partial subgraphs in a library for subsequent use in fabricating said circuit, and wherein said storing step is performed before said fabricating step.

5. A method for designing a digital circuit using a multiplicity of cells, each of said cells comprising a plurality of digital components, said method comprising the steps of:
   selecting a maximum number of series transistors to be permitted in any one cell;
   generating a tree graph representing said digital circuit, said tree graph comprising a multiplicity of nodes and respective children, each of said nodes corresponding to a digital function within said digital circuit and each of said children representing an input for one of the digital functions;
   executing the following algorithm at a multiplicity of said nodes to determine at each of said nodes a number of series transistors "s" required by a cell rooted at said node:

if the node is an AND gate, s=s of node itself plus summation [s of each child−1]
   if the node is an OR gate, s=max [s of each child]
   if the node is an Inverter, s=s of child plus 1
   wherein s=1 for an Inverter;
   s=n for an n input AND gate; and
   s=1 for an n input OR gate;

selecting a partial subgraph rooted at each of said nodes which has an "s" value less than or equal to said maximum number, each of said partial subgraphs comprising the respective root node and one or more descendents of said root node;

fetching or generating data describing a physical representation of one or more of the selected partial subgraphs; and fabricating the circuit using said data for said fetched or generated cells.

6. A method as set forth in claim 5 further comprising the step of identifying partial subgraphs comprising nodes on a critical path through said circuit; and wherein said algorithm is performed using nodes in the critical path and excluding nodes outside of the critical path.

7. A method as set forth in claim 5 wherein data describing physical representations of some of the selected subgraphs are fetched from a library and data describing physical representations of other of the selected subgraphs which occur identically or functionally identically a multiplicity of times in said circuit are generated.

8. A method as set forth in claim 5 further comprising the step of storing the fetched or generated data describing a physical representation of one or more of the selected partial subgraphs in a library for subsequent use in fabricating said circuit.

9. A method for designing a digital circuit using a multiplicity of cells, each of cells comprising a plurality of digital components, said method comprising the steps of:

selecting a maximum delay to be permitted in any one cell;

generating a tree graph representing said cell, said tree graph comprising a multiplicity of nodes and respective children, each of said nodes corresponding to a digital function within said digital circuit and each of said children representing an input for said digital function;

executing the following algorithm at a root node of said cell to determine a number of series pull-down transistors "s" required by said node:

if the node is an AND gate, $s = s$ of node itself plus summation [s of each child $- 1$]
if the node is an OR gate, $s = \max$ [s of each child]
if the node is an Inverter, $s = s$ of child plus 1
wherein $s = 1$ for an Inverter;
$s = n$ for an n input AND gate; and
$s = 1$ for an n input OR gate;

executing the following algorithm at a root node of said cell to determine a number of parallel pull-up transistors "p" required by said node:

if the root is an AND gate, $p = \max[p$ of each child$]$
if the root is an OR gate, $p = p$ of root plus sum[p of each child $- 1$]
if the root is an Inverter, $p = p$ of child plus 1 wherein
$p = 1$ for an inverter,
$p = 1$ for an n input AND gate, and
$p = n$ for an n input OR gate;

estimating delay through said cell based on the equation: delay $= K \times (2 \times p + s)$ where K is a technology dependent parameter proportional to the fall time of a unit size transistor; and if the estimated delay exceeds said predetermined limit, rejecting said cell, and if the estimated delay does not exceed said predetermined limit, fabricating said circuit using said cell.

* * * * *